(12) United States Patent
Tsai

(10) Patent No.: US 11,233,020 B2
(45) Date of Patent: Jan. 25, 2022

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Chung-Hsuan Tsai, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 330 days.

(21) Appl. No.: 16/413,380

(22) Filed: May 15, 2019

(65) Prior Publication Data

US 2019/0267341 A1  Aug. 29, 2019

Related U.S. Application Data

(63) Continuation of application No. 15/495,271, filed on Apr. 24, 2017, now Pat. No. 10,325,868.

(51) Int. Cl.
  *H01L 23/00* (2006.01)
  *H01L 23/31* (2006.01)
  (Continued)

(52) U.S. Cl.
  CPC ............ *H01L 24/02* (2013.01); *H01L 21/561* (2013.01); *H01L 21/568* (2013.01); *H01L 21/6835* (2013.01); *H01L 23/3114* (2013.01); *H01L 24/13* (2013.01); *H01L 24/96* (2013.01); *H01L 23/3128* (2013.01); *H01L 2221/68359* (2013.01); *H01L 2224/0233* (2013.01); *H01L 2224/0235* (2013.01); *H01L 2224/02311* (2013.01); *H01L 2224/12105* (2013.01);
  (Continued)

(58) Field of Classification Search
  CPC ..... H01L 24/02; H01L 21/561; H01L 21/568; H01L 23/3114; H01L 24/96
  USPC ............................................. 257/774; 438/15
  See application file for complete search history.

(56) References Cited

U.S. PATENT DOCUMENTS 7,952,185 B2   5/2011  Theuss et al.
8,361,842 B2   1/2013  Yu et al.
(Continued)

FOREIGN PATENT DOCUMENTS

CN        105489516 A       4/2016

OTHER PUBLICATIONS

Non-Final Office Action for U.S. Appl. No. 15/495,271, dated Jul. 17, 2018, 6 pages.
(Continued)

*Primary Examiner* — Bo Fan
(74) *Attorney, Agent, or Firm* — Foley & Lardner LLP

(57) ABSTRACT

A semiconductor package device includes: (1) a die having an active surface, a back surface opposite to the active surface and a lateral surface extending between the active surface and the back surface; (2) a first conductive pillar disposed on the active surface of the die and electrically connected to the die, the first conductive pillar having a top surface facing away from the die and a lateral surface substantially perpendicular to the top surface of the first conductive pillar; (3) a dielectric layer disposed on the active surface of the die and fully covering the lateral surface of the first conductive pillar; and (4) a package body encapsulating the back surface and the lateral surface of the die.

31 Claims, 6 Drawing Sheets

(51) Int. Cl.
*H01L 21/56* (2006.01)
*H01L 21/683* (2006.01)

(52) U.S. Cl.
CPC ............... *H01L 2224/13023* (2013.01); *H01L 2224/13024* (2013.01); *H01L 2224/13025* (2013.01)

(56) References Cited

U.S. PATENT DOCUMENTS

| | | |
|---|---|---|
| 2004/0041270 A1 | 3/2004 | Shimizu et al. |
| 2009/0321911 A1 | 12/2009 | Son |
| 2010/0284125 A1 | 11/2010 | Moon et al. |
| 2011/0018123 A1 | 1/2011 | An et al. |
| 2012/0139115 A1* | 6/2012 | You ........................ H01L 24/11 257/751 |
| 2014/0084416 A1 | 3/2014 | Kang |
| 2016/0086825 A1* | 3/2016 | Scanlan .............. H01L 21/6835 438/15 |

OTHER PUBLICATIONS

Notice of Allowance for U.S. Appl. No. 15/495,271 dated Feb. 8, 2019, 8 pages.

* cited by examiner

SEMICONDUCTOR PACKAGE DEVICE AND METHOD OF MANUFACTURING THE SAME

CROSS-REFERENCE TO RELATED APPLICATIONS

This application is a continuation of U.S. patent application Ser. No. 15/495,271, filed Apr. 24, 2017, the contents of which are incorporated herein by reference in their entirety.

BACKGROUND

1. Technical Field

The present disclosure relates generally to a semiconductor package device and a method of manufacturing the same. More particularly, the present disclosure relates to a semiconductor package device including a fan-out structure and a method of manufacturing the same.

2. Description of the Related Art

With the evolving of semiconductor technologies, semiconductor chips and/or dies are becoming increasingly smaller. In the meantime, more circuits of various functions are to be integrated into the semiconductor dies. Accordingly, the semiconductor dies tend to have increasing numbers of I/O pads packed into smaller areas, and the densities of the I/O pads rise quickly with time. As a result, the packaging of the semiconductor dies becomes more difficult, which adversely affects the yield of the packaging.

SUMMARY

In one or more embodiments, a semiconductor package device includes: (1) a die having an active surface, a back surface opposite to the active surface and a lateral surface extending between the active surface and the back surface; (2) a first conductive pillar disposed on the active surface of the die and electrically connected to the die, the first conductive pillar having a top surface facing away from the die and a lateral surface substantially perpendicular to the top surface of the first conductive pillar; (3) a dielectric layer disposed on the active surface of the die and fully covering the lateral surface of the first conductive pillar; and (4) a package body encapsulating the back surface and the lateral surface of the die.

In one or more embodiments, a semiconductor package device includes: (1) a die having an active surface, a back surface opposite to the active surface and a lateral surface extending between the active surface and the back surface; (2) a first conductive pillar disposed on the active surface of the die and electrically connected to the die; (3) a dielectric layer disposed on the active surface of the die, the dielectric layer having a top surface facing away from the die; and (4) a package body encapsulating the back surface and the lateral surface of the die, wherein the first conductive pillar is physically isolated from the top surface of the dielectric layer.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
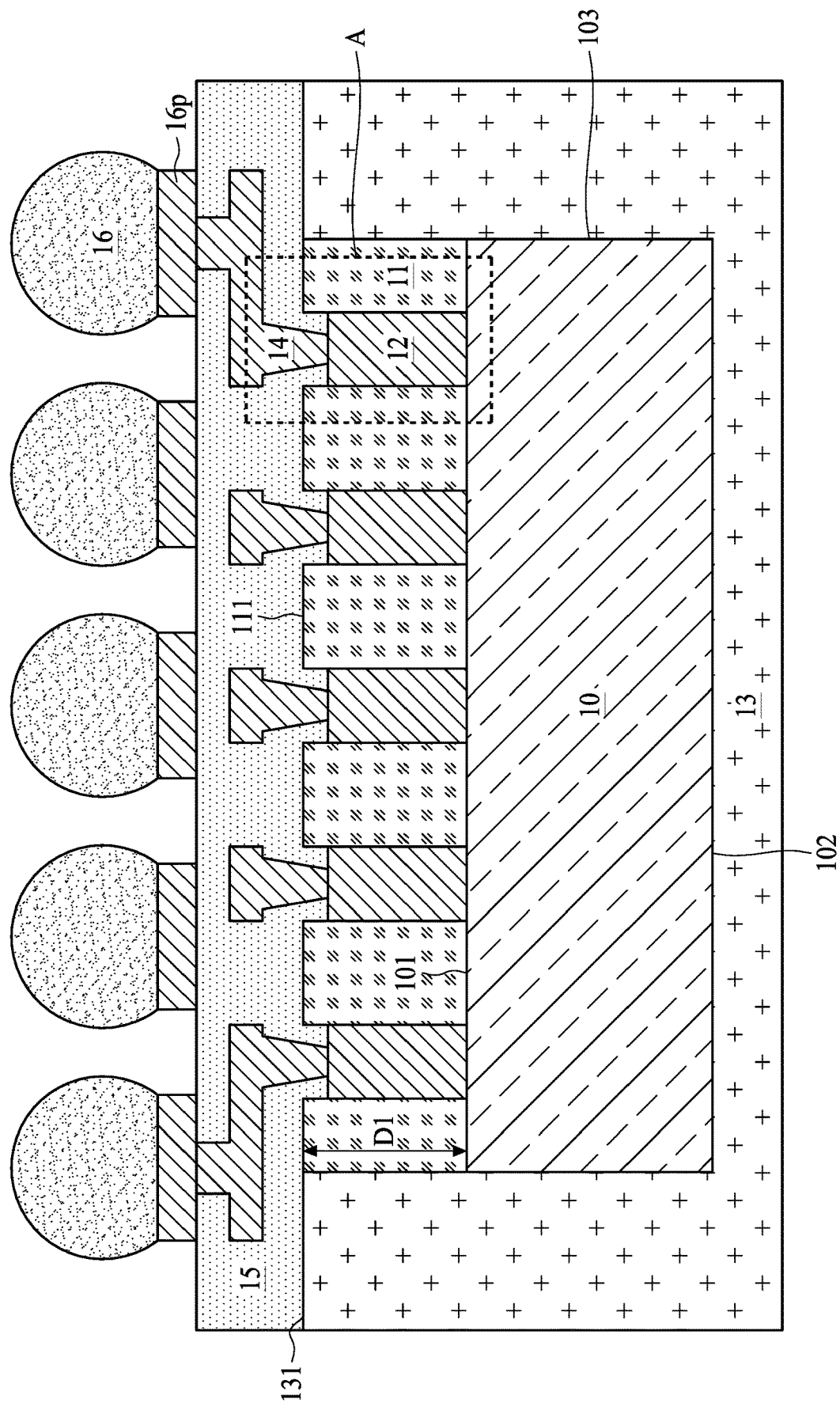
FIG. 1A illustrates a cross-sectional view of a semiconductor package device in accordance with some embodiments of the present disclosure.

Manufacturing and use of the embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the FIGs. are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

In accordance with at least some embodiments of the present disclosure, a semiconductor package device with a fan-out structure is disclosed. In some embodiments, the process of fabricating the fan-out structure (also referred to as fan-out process) may include a face-up process and/or a face-down process. During the face-up process, a backside of a die is in direct contact with an adhesive layer. After a molding process and forming a redistribution layer (RDL), the adhesive layer is removed to expose the backside of the die. An additional backside film is used to protect the backside of the die, which may increase the manufacturing cost and time. Furthermore, during the face-up process, a molding compound may cover conductive pillars. Additional process may be performed for grinding the molding compound to expose the conductive pillars.

In contrast, during the face-down process, a package body is formed to cover the backside of the die and a dielectric layer. The surfaces of the die are protected by a single operation of forming the package body without additional backside film. Furthermore, top surfaces of the conductive pillars are in contact with a carrier instead of the package body. Once the carrier is removed, the top surfaces of the conductive pillars are exposed without any grinding process. Therefore, the face-down process, which includes forming the package body to cover the backside of the die, reduces the manufacturing cost and time.

FIG. 1A illustrates a cross-sectional view of a semiconductor package device 1 in accordance with some embodiments of the present disclosure. The semiconductor package device 1 includes a die (or chip) 10, a dielectric layer 11, one or more conductive pillars 12, a package body 13, one or more electrical connections 14, a passivation layer 15 and one or more conductive contacts 16.

The die 10 has an active surface 101 and a back surface 102 (also referred to as backside) opposite to the active surface 101. The die 10 may include a semiconductor substrate, one or more integrated circuit devices and one or more overlying interconnection structures therein. The integrated circuit devices may include active devices such as transistors and/or passive devices such resistors, capacitors, inductors, or a combination thereof.

The dielectric layer 11 is disposed on the active surface 101 of the die 10 to encapsulate or cover the active surface 101 of the die 10. In some embodiments, the dielectric layer 11 may define a plurality of openings filled with the conductive pillars 12. In some embodiments, the dielectric layer 11 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or another dielectric material of the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials or sheets. In some embodiments, a thickness D1 of the dielectric layer 11 is in a range from about 5 micrometer (μm) to about 25 μm, from about 2 μm to about 50 μm, from about 1 μm to about 100 μm, or from about 0.5 μm to about 200 μm.

The conductive pillars 12 are disposed within the corresponding openings of the dielectric layer 11 and electrically contact conductive contacts of the active surface 101 of the die 10. In some embodiments, the conductive pillars 12 may comprise copper. However, other conductive materials such as nickel and/or aluminum or a combination of various conductive materials may also be used in the conductive pillars 12. In some embodiments, the height of each conductive pillar 12 may be different. In other words, there may be a height difference between any two of the conductive pillars 12 or at least two of the conductive pillars 12. In some embodiments, the height difference between any two of the conductive pillars 12 (e.g., a difference between a top surface of the conductive pillar and a top surface of another conductive pillar) may be greater than 0 μm (e.g., at least about 10 nanometers (nm) or at least about 50 nm or at least about 100 nm) and less than about 2 μm, greater than 0 μm and less than about 5 μm, greater than 0 μm and less than about 10 μm, or greater than 0 μm and less than about 20 μm.

In some other embodiments, the heights of the conductive pillars 12 may be about the same.

Figure 1B:
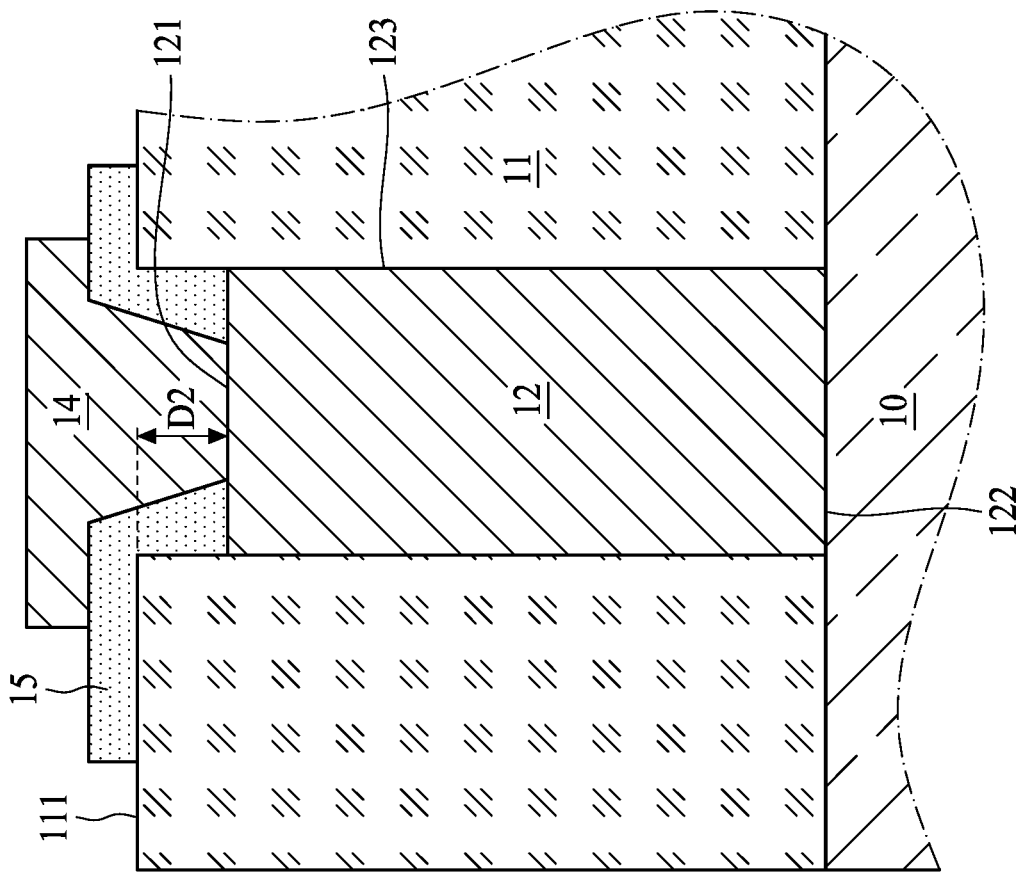
FIG. 1B illustrates an enlarged view of a portion of the semiconductor package device as shown in FIG. 1A in accordance with some embodiments of the present disclosure.

FIG. 1B illustrates an enlarged view of a portion of the semiconductor package device 1 that is circled by a dashed line box A in FIG. 1A. As shown in FIG. 1B, the conductive pillar 12 includes a top surface 121 and a bottom surface 122 opposite to the top surface 121. The bottom surface 122 of the conductive pillar 12 may electrically contact the conductive contact of the die 10. In some embodiments, the top surface 121 of the conductive pillar 12 is lower than a top surface 111 of the dielectric layer 11. For example, there may be a cavity defined by the top surface 121 of the conductive pillar 12 and a sidewall of the opening of the dielectric layer 11.

In some embodiments, if a distance D2 between the top surface 111 of the dielectric layer 11 and the top surface 121 of the conductive pillar 12 is large (e.g., greater than about 2 μm, greater than about 5 μm, greater than about 10 μm, or greater than about 20 μm), due to an incomplete development process, the passivation layer 15 may completely cover the top surface 121 of the conductive pillar 12, and thus the electrical connections 14 cannot be electrically connected to the conductive pillar 12. Therefore, in some embodiments, the distance D2 is less than about 2 μm, less than about 5 μm, less than about 10 μm, or less than about 20 μm. In some embodiments, the passivation layer 15 may define one or more openings to expose the top surface(s) 121 of one or more conductive pillars 12. The widths of the openings of the passivation layer 15 may be less than a width of the cavity of the dielectric layer 11.

Referring back to FIG. 1A, the package body 13 is disposed to cover or encapsulate the back surface 102 and the lateral surface of the die 10 and the lateral surface of the dielectric layer 11. In some embodiments, a surface 131 of the package body 13 may be substantially coplanar with the top surface 111 of the dielectric layer 11. In some embodiments, the package body 13 may include an epoxy resin having fillers, a molding compound (e.g., an epoxy molding compound or other molding compound), a polyimide, a phenolic compound or material, a material with a silicone dispersed therein, or a combination thereof.

The passivation layer 15 is disposed on the surface 131 of the package body 13 and the top surface 111 of the dielectric layer 11. In some embodiments, as shown in FIG. 1B, the passivation layer 15 may extend into one or more cavities. Each cavity is defined by the top surface 121 of the conductive pillar 12 and a sidewall of the opening of the dielectric layer 11. The passivation layer 15 may cover a portion of the top surface 121 of the conductive pillar 12 and expose another portion of the top surface 121 of the conductive pillar 12. In some other embodiments, the passivation layer 15 may not extend into one or more cavities defined by the top surfaces 121 of the conductive pillars 12 and sidewalls of the openings of the dielectric layer 11. In some embodiments, the passivation layer 15 may include, e.g., silicon oxide, silicon nitride, gallium oxide, aluminum oxide, scandium oxide, zirconium oxide, lanthanum oxide, hafnium oxide, or a combination thereof. In some embodiments, the passivation layer 15 may define one or more openings to expose the top surface(s) 121 of one or more conductive pillars 12. The widths of the openings of the passivation layer 15 may be less than widths of the openings of the dielectric layer 11.

Conductive pads 16p are disposed on the passivation layer 15 and the conductive contacts 16 are disposed on the corresponding conductive pads 16p. In some embodiments, the conductive contacts 16 may be, e.g., solder balls. The conductive contacts 16 are electrically connected to the conductive pillars 12 through the electrical connections 14.

The electrical connections 14 are encapsulated by the passivation layer 15 and electrically connect the conductive pillars 12 to the corresponding conductive contacts 16. As shown in FIG. 1B, the electrical connection 14 extends into the opening of the dielectric layer 11 and contacts at least a portion of the top surface 121 of the conductive pillar 12 that is not covered by the passivation layer 15. In some other embodiments, the electrical connection 14 contacts the entire top surface 121 of the conductive pillar 12, if the passivation layer 15 does not extend into the cavity defined by the top surface 121 of the conductive pillar 12 and a sidewall of the opening of the dielectric layer 11.

In some embodiments, the disclosed semiconductor package device (e.g., the semiconductor package device 1 as illustrated in FIG. 1A) may be fabricated by depositing various layers and components on top of one or more semiconductor dies. FIGS. 2A, 2B, 2C and 2D are cross-sectional views of a semiconductor structure fabricated at various stages, in accordance with some embodiments of the present disclosure. Various FIGs. have been simplified for a better understanding of the aspects of the present disclosure.

Figure 2A:
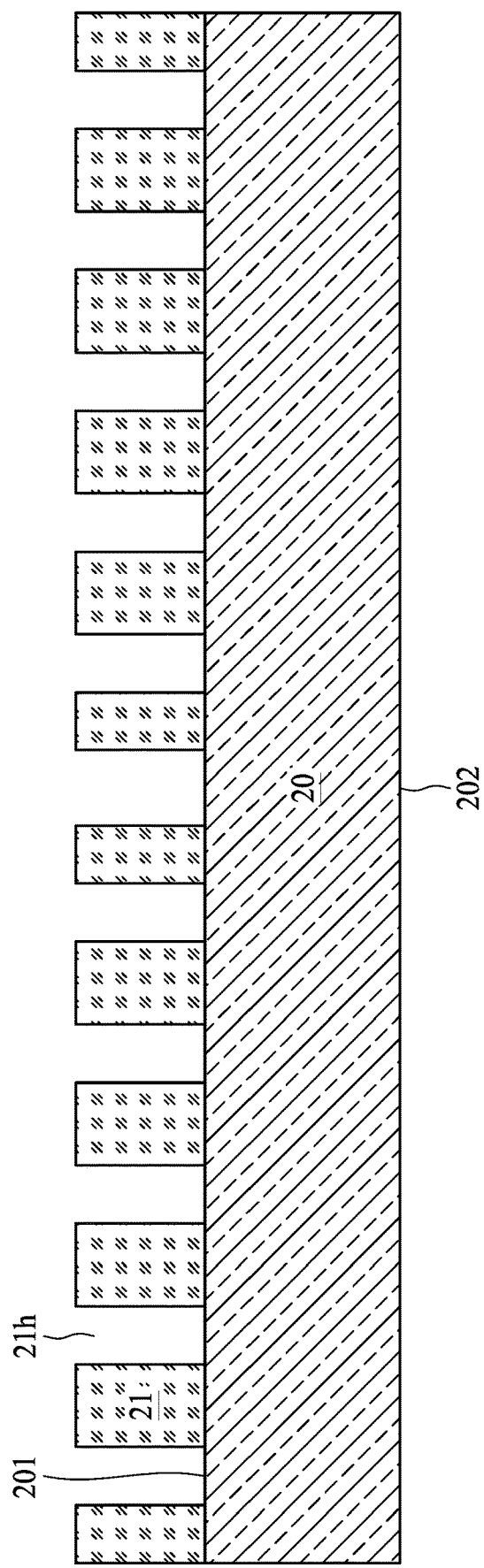
FIG. 2A illustrates various stage(s) of a method of manufacturing a semiconductor package device in accordance with some embodiments of the present disclosure.

Referring to FIG. 2A, a die strip (e.g., a wafer) including a die 20 is provided. The die strip has an active surface 201 and a back surface 202 (also referred to as backside) opposite to the active surface 201. Each die 20 may include a semiconductor substrate, one or more integrated circuit devices and one or more overlying interconnection structures therein. The integrated circuit devices may include one or more active devices such as transistors and/or passive devices such resistors, capacitors, inductors or a combination thereof.

A dielectric layer 21 is formed on the active surface 201 of the die strip, and then a plurality of openings 21h are formed to expose at least a portion of the active surface 201 of the die strip. In some embodiments, the opening 20h can be formed by, e.g., routing, etching or other suitable processes.

Figure 2B:
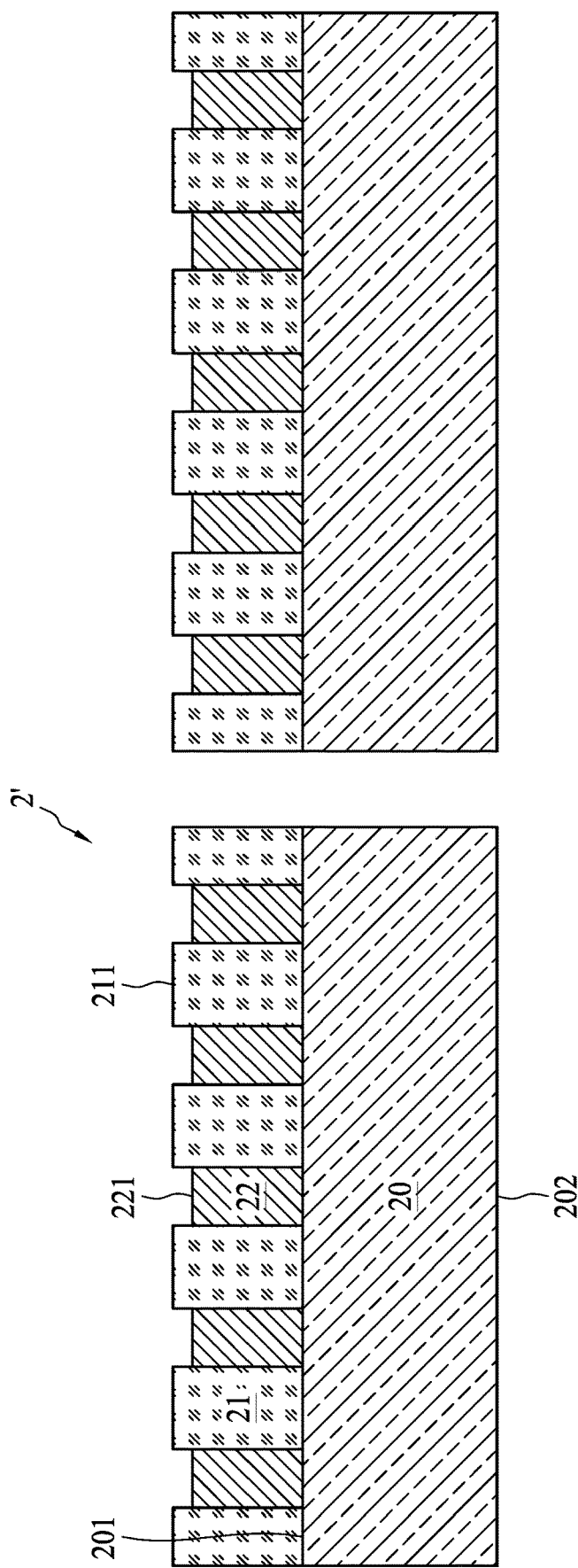
FIG. 2B illustrates various stage(s) of a method of manufacturing a semiconductor package device in accordance with some embodiments of the present disclosure.

Referring to FIG. 2B, conductive pillars 22 are formed within the openings 20h of the dielectric layer 21 to contact conductive contacts of the active surface 201 of the die 20. In some embodiments, a top surface 221 of at least one conductive pillar 22 is lower than a top surface 211 of the dielectric layer 21. In some embodiments, a distance between the top surface 211 of the dielectric layer 21 and the top surface 221 of at least one conductive pillar 22 is less than about 2 μm, less than about 5 μm, less than about 10 μm, or less than about 20 μm. In some embodiments, if the distance between the top surface 211 of the dielectric layer 21 and the top surface 221 of the conductive pillar 22 exceeds about 2 μm, about 5 μm, about 10 μm, or about 20 μm, the passivation layer, which may be formed in the subsequent operation, may completely cover the top surface 221 of at least one conductive pillar 22, and thus the at least one conductive pillar 22 cannot be electrically connected to electrical connections. In some embodiments, the conductive pillars 22 may be formed by, e.g., electroplating or other suitable techniques. The height of the conductive pillars 22 may be determined by, e.g., controlling the electroplating current or electroplating time.

In some embodiments, grinding process is not applied to the conductive pillar 22, and the height of each conductive pillar 22 may be different. In other words, there may be a height difference between any two or at least two of the conductive pillars 22. In some embodiments, the height difference between any two or at least two of the conductive pillars 22 (e.g., a difference between a top surface of the conductive pillar and a top surface of another conductive pillar) may be greater than 0 μm and less than about 2 μm, greater than 0 μm and less than about 5 μm, greater than 0 μm and less than about 10 μm, or greater than 0 μm and less than about 20 μm. In some other embodiments, the heights of the conductive pillars 12 may be about the same. In some embodiments, the conductive pillars 22 may comprise, e.g., copper. However, other conductive materials such as nickel and/or aluminum or a combination of different conductive materials may also be used in the conductive pillars 22.

A singulation process may be performed to separate out individual semiconductor package devices 2'. That is, the singulation process is performed through the dielectric layer 21 and the die strip including the die 20. The singulation process may be carried out, for example, by using a dicing saw, laser or other appropriate cutting technique.

In some other embodiments, the conductive pillars 22 may be formed prior to the formation of the dielectric layer 21. For example, in FIG. 2A, the conductive pillars 22 may be formed on the active surface 201 of the die strip, and then the dielectric layer 21 may be formed to surround the conductive pillars 22 and to expose the top surface 221 of the conductive pillars 22. In some embodiments, the conductive pillars 22 may be formed by, e.g., dry film exposure, development and electroplating.

Figure 2C:
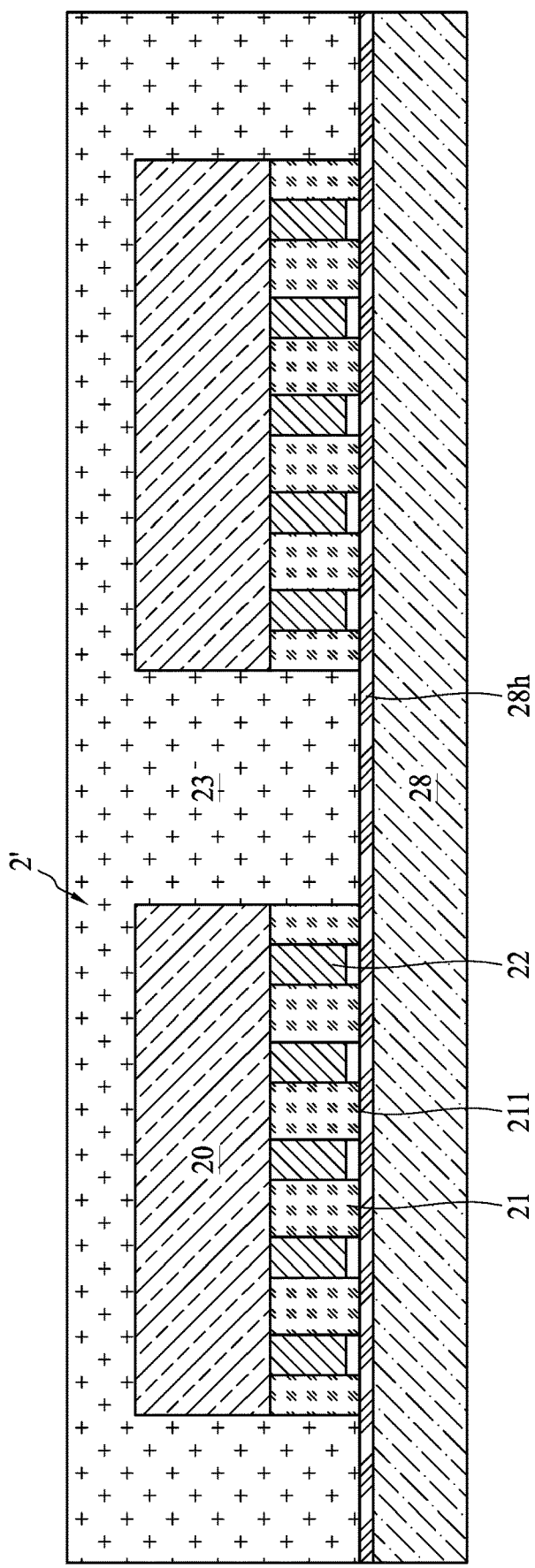
FIG. 2C illustrates various stage(s) of a method of manufacturing a semiconductor package device in accordance with some embodiments of the present disclosure.

Referring to FIG. 2C, the individual semiconductor package devices 2' are attached to a carrier 28. In some embodiments, the semiconductor package device 2' are attached to a carrier 28 by, e.g., attaching the top surface 211 of the dielectric layer 21 to an adhesive layer 28h (which may include, e.g., glue or tape) of the carrier 28. In some embodiments, this process may be referred to as "face-down process." As shown in FIG. 2C, a space is defined by the carrier 28, the top surface of each conductive pillar 22, and a sidewall of the dielectric layer 21.

A package body 23 is formed on the carrier 28 to cover the semiconductor package devices 2'. In some embodiments, the package body 23 may include, e.g., an epoxy resin including fillers, a molding compound (e.g., an epoxy molding compound or other molding compound), a polyimide, a phenolic compound or material, a material including a silicone dispersed therein, or a combination thereof. The package body 23 may be formed by, e.g., a molding technique, such as transfer molding or compression molding.

In other embodiments, at least one conductive pillar may protrude from a dielectric layer, e.g., the top surface of the at least one conductive pillar is higher than the top surface of the dielectric layer, Thus, during the operation for attaching the dielectric layer to a carrier, the at least one conductive pillar may contact the carrier and there may be a gap between the dielectric layer and the carrier. However, an interface or a boundary between a metal and an organic material (e.g., the at least one conductive pillar and an adhesive layer of the carrier) has a relatively low binding strength. During the operation to form the package body, the molding material(s) may flush into a gap between the at least one conductive pillar and the carrier to detach the semiconductor package device from the carrier (referred to as "flying die").

In contrast, in the embodiments shown in FIG. 2B, the top surfaces 221 of the conductive pillars 22 are lower than the top surface 211 of the dielectric layer 21. An interface or a boundary between two organic materials (e.g., the dielectric layer 21 and the adhesive layer 28h) has a relatively high binding strength. During the operation for attaching the dielectric layer 21 to the carrier 28, the dielectric layer 21 can be fastened to the adhesive layer 28h of the carrier 28 securely, which can avoid the semiconductor package device 2' from detaching from the carrier 28.

Figure 2D:
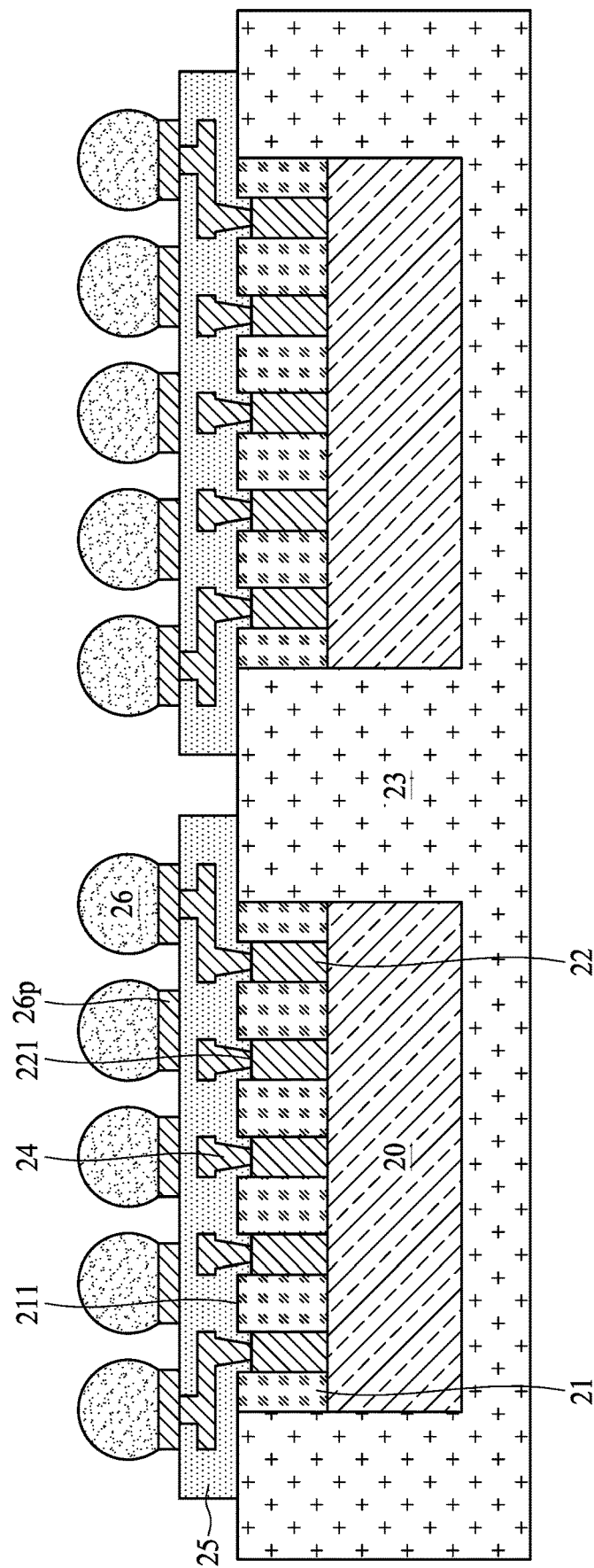
FIG. 2D illustrates various stage(s) of a method of manufacturing a semiconductor package device in accordance with some embodiments of the present disclosure.

Referring to FIG. 2D, the semiconductor structure shown in FIG. 2C is inverted. The carrier 28 is then removed, and a RDL structure is formed on the dielectric layer 21. The RDL structure is electrically connected with the die 20 through the conductive pillars 22. A passivation layer 25 with one or more interconnection structures 24 is formed on the top surface 211 of the dielectric layer 21 and extends into one or more openings defined by the top surfaces 221 of the conductive pillars 22 and sidewalls of the openings of the dielectric layer 21. The interconnection structures 24 electrically contact to the top surfaces 221 of the conductive pillars 22.

Conductive pads 26p are formed on the passivation layer 25 to contact the interconnection structures 24 exposed from the passivation layer 25. The conductive contacts 26 are formed on the corresponding conductive pads 26p to electrically connect to the conductive pillars 22 through the interconnection structures 24. In some embodiments, the conductive contacts 26 may be, e.g., solder balls.

A singulation process may be performed for the semiconductor structure shown in FIG. 2D to form the semiconductor package device 1 as shown in FIG. 1A. The singulation process may be carried out, for example, by using a dicing saw, laser or other appropriate cutting technique.

In some other embodiments, after the operation shown in FIG. 2B, the back surface 202 of the die 20 is attached to the carrier 28 and a package body 23 is formed to cover the dielectric layer 21 and the lateral surface of the die 20. After removing the carrier 28, the back surface 202 of the die 20 is exposed and a backside film may be formed on the back surface 202 of the die to protect the die 20 (this process is referred to as "face-up" process). During the face-up process, an additional operation may be carried out to form the backside film, which may increase the manufacturing cost and time. In addition, during the face-up process, the molding compound may completely cover the conductive pillars 22. Thus, an additional process may be performed for grinding the molding compound to expose the conductive pillars 22, which may increase the manufacturing cost and time as well.

In contrast, in the embodiments shown in FIG. 2C (e.g., face-down process), the package body 23 is formed to cover the dielectric layer 21, the back surface 202 and lateral surface of the die 28. In this way, all surfaces of the die 28 may be protected by a single operation, which may reduce the manufacturing cost and time. In addition, during the operation shown in FIG. 2C, since the conductive pillars 22 face to the carrier 28, the package body 23 covers the die 20 and a portion of the dielectric layer 21 and is not in direct contact with the top surfaces 221 of the conductive pillars 22. After the carrier 28 is removed, the top surfaces 221 of the conductive pillars 22 are exposed without any additional grinding process, which may reduce the manufacturing cost and time.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
a die having an active surface;
a first conductive pillar disposed on the active surface, the first conductive pillar having a top surface facing away from the die and a lateral surface substantially perpendicular to the top surface of the first conductive pillar;
a dielectric layer disposed on the active surface and fully covering the lateral surface of the first conductive pillar, wherein the dielectric layer has a top surface and a bottom surface, and the die is located farther from the top surface of the dielectric layer than from the bottom surface of the dielectric layer; and
a package body encapsulating the die and the dielectric layer, the package body having a top surface above the active surface;
wherein the top surface of the dielectric layer is substantially coplanar with the top surface of the package body facing away from the die.

2. The semiconductor package device of claim 1, wherein a thickness of the dielectric layer is equal to or larger than a height of the first conductive pillar.

3. The semiconductor package device of claim 1, wherein the top surface of the first conductive pillar and the dielectric layer define a recess.

4. The semiconductor package device of claim 3, further comprising an electrical connection disposed within the recess and electrically connected to the top surface of the first conductive pillar.

5. The semiconductor package device of claim 3, further comprising a passivation layer disposed within the recess and covering the top surface of the first conductive pillar.

6. The semiconductor package device of claim 5, further comprising a conductive contact disposed on the passivation layer and electrically connected to the first conductive pillar through the electrical connection.

7. The semiconductor package device of claim 3, further comprising a passivation layer disposed on the dielectric layer and the package body.

8. The semiconductor package device of claim 7, wherein a lateral surface of the passivation layer is substantially coplanar with a lateral surface of the package body.

9. The semiconductor package device of claim 1, wherein a lateral surface of the dielectric layer is substantially coplanar with a lateral surface of the die.

10. A semiconductor package device, comprising:
a die having an active surface, a back surface opposite to the active surface and a lateral surface extending between the active surface and the back surface;
a first conductive pillar disposed on the active surface;
a dielectric layer disposed on the active surface, the dielectric layer having a top surface facing away from the die; and
a package body encapsulating the back surface and the lateral surface,
wherein the first conductive pillar is physically isolated from the top surface of the dielectric layer; and
wherein a lateral surface of the dielectric layer is substantially coplanar with the lateral surface of the die.

11. The semiconductor package device of claim 10, wherein the first conductive pillar has a top surface recessed from the top surface of the dielectric layer.

12. The semiconductor package device of claim 11, wherein a distance between the top surface of the first conductive pillar and the top surface of the dielectric layer is smaller than about 2 µm.

13. The semiconductor package device of claim 11, wherein the top surface of the first conductive pillar and the top surface of the dielectric layer define a recess.

14. The semiconductor package device of claim 10, further comprising a second conductive pillar disposed on the active surface of the die, wherein a difference between a top surface of the first conductive pillar and a top surface of the second conductive pillar is greater than 0 µm and less than about 2 µm.

15. A semiconductor package device, comprising:
a semiconductor die having a front surface and a back surface opposite to the front surface, the front surface and the back surface joined by at least four side surfaces;
a first conductive interconnection having a first end and a second end opposite to the first end, the first conductive interconnection coupled to the front surface through the second end;
a dielectric layer disposed on the front surface and having a top surface over the front surface, the top surface uncovering the first end;
a second conductive interconnection disposed on the first end to define an interface between the first conductive interconnection and the second conductive interconnection, wherein the interface is non-coplanar with the top surface; and
a first encapsulant covering the four side surfaces of the semiconductor die and uncovering the second conductive interconnection, wherein an edge of the dielectric layer is recessed from an edge of the first encapsulant.

16. The semiconductor package device of claim 15, wherein the first encapsulant has a top surface uncovering the top surface of the dielectric layer.

17. The semiconductor package device of claim 15, wherein the first conductive interconnection further has a side surface completely covered by the dielectric layer.

18. The semiconductor package device of claim 17, wherein the side surface is not in contact with the interface.

19. The semiconductor package device of claim 15, wherein the dielectric layer further has an opening, and the first conductive interconnection is disposed within the opening.

20. The semiconductor package device of claim 19, wherein the second conductive interconnection protrudes toward the opening to reach the interface.

21. The semiconductor package device of claim 20, further comprising a passivation layer partially disposed on the dielectric layer and partially disposed within the opening to enclose the protruding portion of the second conductive interconnection.

22. The semiconductor package device of claim 21, wherein the passivation layer is in contact with the first conductive interconnection.

23. The semiconductor package device of claim 15, further comprising a second encapsulant covering the back surface and in contact with the first encapsulant.

24. The semiconductor package device of claim 3, wherein an inner lateral surface of the recess is substantially coplanar with the lateral surface of the first conductive pillar.

25. The semiconductor package device of claim 3, further comprising a passivation layer disposed within the recess and contacting an inner lateral surface of the recess.

26. The semiconductor package device of claim 1, wherein the package body further encapsulates a lateral surface of the dielectric layer.

27. The semiconductor package device of claim 26, wherein the package body contacts the lateral surface of the dielectric layer.

28. The semiconductor package device of claim 13, wherein an inner lateral surface of the recess is substantially coplanar with a lateral surface of the first conductive pillar.

29. The semiconductor package device of claim 13, further comprising a passivation layer disposed within the recess and contacting an inner lateral surface of the recess.

30. The semiconductor package device of claim 15, wherein the first encapsulant covers a portion of a lateral surface of the second conductive interconnection.

31. The semiconductor package device of claim 15, further comprising a passivation layer, wherein the second conductive interconnection is within the passivation layer, and an edge of the passivation layer is recessed from an edge of the first encapsulant.

\* \* \* \* \*